US010656522B2

(12) United States Patent
Wang

(10) Patent No.: US 10,656,522 B2
(45) Date of Patent: May 19, 2020

(54) COMPOSITION FOR FORMING FINE RESIST PATTERN AND PATTERN FORMING METHOD USING SAME

(71) Applicant: AZ Electronic Materials (Luxembourg) S.a.r.l., Luxembourg (LU)

(72) Inventor: Xiaowei Wang, Kakegawa (JP)

(73) Assignee: AZ Electronic Materials (Luxembourg) S.a.r.l., Luxembourg (LU)

( * ) Notice: Subject to any disclaimer, the term of this patent is extended or adjusted under 35 U.S.C. 154(b) by 0 days.

(21) Appl. No.: 15/775,661

(22) PCT Filed: Nov. 2, 2016

(86) PCT No.: PCT/EP2016/001816
§ 371 (c)(1),
(2) Date: May 11, 2018

(87) PCT Pub. No.: WO2017/084741
PCT Pub. Date: May 26, 2017

(65) Prior Publication Data
US 2018/0329301 A1    Nov. 15, 2018

(30) Foreign Application Priority Data

Nov. 19, 2015 (EP) .................................... 15003294

(51) Int. Cl.
| | | |
|---|---|---|
| *G03F 7/11* | (2006.01) | |
| *G03F 7/40* | (2006.01) | |
| *C09D 139/04* | (2006.01) | |
| *C09D 139/08* | (2006.01) | |
| *G03F 7/038* | (2006.01) | |
| *G03F 7/16* | (2006.01) | |

(52) U.S. Cl.
CPC .............. *G03F 7/11* (2013.01); *C09D 139/04* (2013.01); *C09D 139/08* (2013.01); *G03F 7/038* (2013.01); *G03F 7/16* (2013.01); *G03F 7/168* (2013.01); *G03F 7/405* (2013.01); *C08L 2201/56* (2013.01)

(58) Field of Classification Search
CPC ... G03F 7/11; G03F 7/16; G03F 7/038; G03F 7/168; G03F 7/405; C09D 139/08; C09D 139/04; C08L 2201/56
See application file for complete search history.

(56) References Cited

U.S. PATENT DOCUMENTS

| 2,606,832 | A  * | 8/1952  | Alles ...................... G03C 1/053 |
|---|---|---|---|
|  |  |  | 430/536 |
| 6,471,349 | B1 * | 10/2002 | Aurenty ................ B41C 1/1066 |
|  |  |  | 347/100 |
| 6,558,873 | B1 * | 5/2003  | Oshima ................... G03F 7/094 |
|  |  |  | 430/275.1 |
| 7,141,177 | B2   | 11/2006 | Tanaka |
| 8,771,927 | B2 * | 7/2014  | Tang ................... B81C 1/00801 |
|  |  |  | 430/313 |
| 9,448,485 | B2   | 9/2016  | Okayasu et al. |
| 9,671,697 | B2 * | 6/2017  | Zhou ....................... G03F 7/002 |
| 2006/0088788 | A1 | 4/2006  | Kudo et al. |
| 2009/0317739 | A1 | 12/2009 | Thiyagarajan et al. |
| 2011/0256363 | A1 * | 10/2011 | Satou ..................... H05K 3/387 |
|  |  |  | 428/209 |
| 2012/0296186 | A1 * | 11/2012 | Ouyang ............. A61B 5/14532 |
|  |  |  | 600/347 |
| 2013/0183626 | A1 | 7/2013 | Namiki et al. |
| 2015/0017587 | A1 | 1/2015 | Okayasu et al. |
| 2016/0187782 | A1 | 6/2016 | Hustad et al. |
| 2016/0195814 | A1 | 7/2016 | Enomoto et al. |
| 2016/0274464 | A1 | 9/2016 | Tsuchiya et al. |
| 2016/0357111 | A1 | 12/2016 | Jain et al. |
| 2017/0123316 | A1 * | 5/2017 | Zhou ..................... C08F 293/00 |
| 2017/0170008 | A1 * | 6/2017 | Park ..................... C09D 125/08 |

FOREIGN PATENT DOCUMENTS

| JP | 2003084457 A | 3/2003 |
|---|---|---|
| JP | 2013083818 A | 5/2013 |
| JP | 2013145290 A | 7/2013 |
| WO | WO-2015037467 A1 | 3/2015 |

OTHER PUBLICATIONS

"Why is imidazole (C3H4N2) aromatic?" from Socratic, downloaded from the world wide web, dated Dec. 1, 2015, one page. (Year: 2015).*
International Search Report for PCT/EP2016/001816 dated Feb. 7, 2017.
Written Opinion of the International Searching Authority for PCT/EP2016/001816 dated Feb. 7, 2017.

* cited by examiner

*Primary Examiner* — Cynthia Hamilton
(74) *Attorney, Agent, or Firm* — Faegre Drinker Biddle & Reath LLP

(57) ABSTRACT

The present invention relates to a shrink material composition for fattening a resist pattern prepared from a negative-tone lithography process, comprising at least one polymer and at least one organic solvent, wherein the at least one polymer comprises at least one structural unit of a nitrogen heteroaromatic ring system.

12 Claims, No Drawings

COMPOSITION FOR FORMING FINE RESIST PATTERN AND PATTERN FORMING METHOD USING SAME

CROSS-REFERENCE TO RELATED APPLICATIONS

This application is a national stage application(under 35 U.S.C. § 371) of PCT/EP2016/001816, filed Nov. 2, 2016, which claims benefit of European Application No. 15003294.4, filed Nov. 19, 2015.

TECHNICAL FIELD

The present invention relates to a composition for forming a fine resist pattern miniaturized by fattening or thickening a beforehand formed resist pattern in a production process of semiconductor devices and the like, and this invention also relates to a resist pattern formation method employing that composition.

BACKGROUND ART

In manufacturing semiconductor devices, resist patterns have been required to be made minute enough to meet increased integration density and highly accelerated processing speed in LSIs. Resist patterns are normally formed in photo-lithographic processes from, for example, positive-working type resists, whose solubility to alkaline developers are increased by exposure to light. Accordingly, the resists in the areas exposed to light are removed away with the alkaline developers to form positive resist patterns. However, the fineness of the resultant patterns greatly depends on the exposure methods and light sources, and hence in order to stably produce fine resist patterns, a huge investment is necessary to install special and expensive facilities and equipment needed for the exposure methods and light sources capable of ensuring the fineness.

In view of that, there are various techniques studied for further miniaturizing resist patterns formed beforehand by conventional methods. For example, they include a practical method in which a resist pattern stably produced by a conventional method is coated with a composition comprising a water-soluble resin and optional additives so as to fatten or thicken the resist pattern and thereby to reduce the diameter of holes and/or the width of furrow lines separating the ridges in the pattern.

The composition containing a polymer comprising a repeating unit with nitrogen is known to interact with residual acid in the resist pattern to fatten the resist pattern and to form a desired fine space pattern (US 2006/0088788 A1, Japanese Patent Application Laid Open (JP-A) No. 2013-83818). Furthermore, a nitrogen heteroaromatic ring unit in the polymer of the composition is known to improve a dry etching resistance of the resist pattern (Japanese Patent Application Laid Open (JP-A) No. 2003-84457).

However, the composition of aqueous solution has an issue on coatability. Surfactant is inevitable for the composition to come into use. Moreover, the type of chemical agents that can be linked to a coater/developer track to be used in semiconductor process at present is limited to resist materials and rinse solutions, and it is very difficult to set up a new process line for a new chemical agent. In the conventional semiconductor process, it is not based on the assumption that an aqueous solution material is applied over a surface of a resist pattern, and thus it is also difficult to use such an aqueous solution material because of the necessity of a new control for waste fluid.

With the use of an organic solvent composition using novolac resin or p-hydroxystyrene-styrene copolymer described in Japanese Patent Application Laid Open (JP-A) No. 2013-145290, it has been known that the use of the organic solvent composition is not sufficient in thickening a negative-tone resist pattern.

SUMMARY OF THE INVENTION

The present invention relates to a shrink material composition for fattening a resist pattern prepared from a negative-tone lithography process comprising a polymer containing a nitrogen heteroaromatic ring system. The present invention also relates to a process for forming a fattened resist pattern comprising providing a substrate with a resist pattern, coating the resist pattern with the novel shrink material, inter-mixing a portion of the shrink material in contact with the resist pattern, and removing a portion of the shrink material which is not inter-mixed, with a removal solution.

The present invention provides a composition capable of fattening a negative-tone resist pattern in sufficient thickness and improving dry etching resistance of the resist pattern. Further, the composition is compatible with the conventional semiconductor manufacturing process line because of its solvent.

DETAILED DESCRIPTION OF THE INVENTION

The present invention relates to a shrink material composition comprising a polymer containing nitrogen heteroaromatic ring system. The invention also relates to a process for forming a fattened resist pattern, comprising forming a layer of shrink material composition on top of an imaged resist pattern, inter-mixing a portion of the shrink material near the resist interface, and removing the unmixed, soluble portion of the shrink material with a removal solution.

An imaged pattern of resist is formed on a substrate according to processes well-known to those skilled in the art.

When negative-tone resist compositions are exposed image-wise to radiation, the areas of the resist composition exposed to the radiation become less soluble to a developer solution (e.g. a cross-linking reaction occurs) while the unexposed areas of the resist coating remain relatively soluble to such a solution. Thus, treatment of an exposed negative-tone resist with a developer causes removal of the non-exposed areas of the resist coating and the creation of a negative image in the coating, thereby uncovering a desired portion of the underlying substrate surface on which the resist composition was deposited.

Generally, a photoresist comprises a polymer and a photosensitive compound. Examples of photoresist systems, without limitation, are novolak|diazonaphthoquinone, polyhydroxystyrene/onium salts, capped polyhydroxystyrene/onium salts, cycloaliphatic polymers/onium salts, fluoropolymers/onium salts, poly (methacrylic acid)/onium salts, etc. These photoresists are well-known for use at wavelengths ranging from 436 nm to 13.5 nm. Any type of photoresist that is capable of forming an image may be used. A photoresist is coated on a substrate, and the photoresist coating is baked to remove substantially all of the coating solvent. The coating is then exposed with the appropriate wavelength of light, and developed with a suitable developer.

Once a resist pattern is formed on the substrate, a shrink material comprising a polymer containing nitrogen heteroaromatic ring system is coated over the substrate with the resist pattern and inter-mixed with the surface of the resist to form an interface layer which is insoluble in the removing solution. The interface layer is formed by heating the substrate at a suitable temperature for a suitable time. The shrink material penetrates into the polymer of the resist, while the resist polymer defuses into the shrink material. The shrink material composition does not contain a cross-linking agent. The unmixed portion of the shrink material is removed by the removal solution. Typical examples of suitable systems for a shrink material that can inter-mix with the underlying resist are an organic solvent solution comprising a polymer comprising nitrogen heteroaromatic ring system, specifically pyridine ring. The pyridine ring is pendant from the polymer described in formula (1);

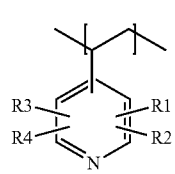

(1)

(wherein,
R1 to R4 are, independently of each other, hydrogen atom or straight chain, branched or cyclic alkyl group with 1 to 20 carbon atoms or substituted or unsubstituted aryl group with 6 to 18 carbon atoms) or a unit of the backbone described in formula (2).

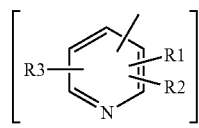

(2)

(wherein,
R1 to R3 are, independently of each other, hydrogen atom or straight chain, branched or cyclic alkyl group with 1 to 20 carbon atoms or substituted or unsubstituted aryl group with 6 to 18 carbon atoms)

The polymer comprising nitrogen heteroaromatic ring system can contain at least one additional repeating unit which is different from the unit of formula (1) and/or (2). The additional repeating unit is derived from a monomer selected from styrene, hydroxystyrene, methyl (acrylate), phenyl (acrylate), methyl (methacrylate), n-butyl (methacrylate), phenyl (methacrylate) and benzyl (methacrylate).

Examples of polymers that are useful are homopolymers and copolymers of vinylpyridine, such as, poly(2-vinylpyridine), poly(3-vinylpyridine), poly(4-vinylpyridine), poly(2-vinylpyridine-co-styrene), poly(3-vinylpyridine-co-styrene), poly(4-vinylpyridine-co-styrene), poly(2-vinylpyridine-co-methylvinylether), poly(3-vinylpyridine-co-methylvinylether), poly(4-vinylpyridine-co-methylvinylether), poly(2-vinylpyridine-co-methacrylic acid), poly(3-vinylpyridine-co-methacrylic acid), poly(4-vinylpyridine-co-methacrylic acid), etc.

Other polymers are poly(3,5 pyridine), poly(2,5 pyridine), poly(3,5 pyridine-co-p-phenylene), poly(3,5 pyridine-co-m-phenylene), poly(2,5 pyridine-co-p-phenylene), poly(2,5 pyridine-co-m-phenylene), etc. can be exemplified. Mixtures of the above mentioned polymers can also be adopted. Crosslinked polymers of the above mentioned polymers can also be used.

If the molecular weight of polymer is too low, pattern shrinkage is not enough. On the other hand, if the molecular weight is too high, unmixed shrink material is not removed. Accordingly the weight average molecular weight of polymer for the shrink material ranges from approximately 1,000 to 30,000 g/mol, preferably from Mw 10,000 to 20,000 g/mol.

Shown below are preferred examples of the homo polymers comprising nitrogen heteroaromatic ring system usable in the present invention. In the formula, n is an integer. The number of pyridine rings in the preferable homo polymers are 96-250.

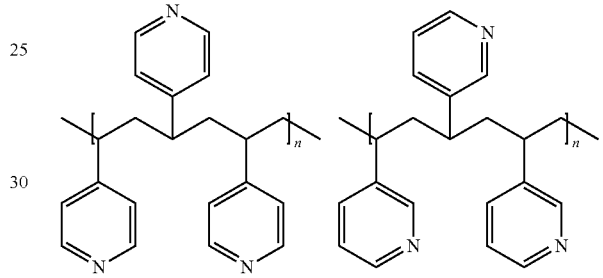

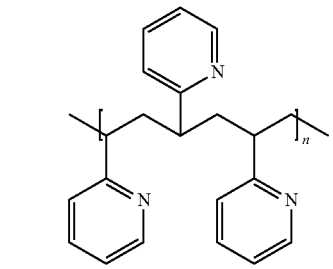

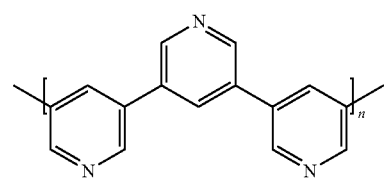

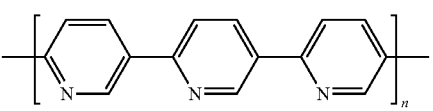

Shown below are preferred examples of the co-polymers comprising nitrogen heteroaromatic ring system usable in the present invention. In the formula, a and b is a number indicating the molar ratio of each repeating unit. The molar ratio of the repeating unit including pyridine ring is 50-90%.

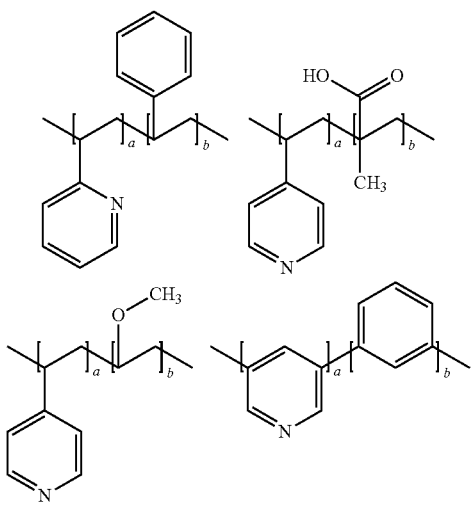

The shrink material comprises a polymer containing nitrogen heteroaromatic ring system and organic solvent, where the polymer concentration ranged from 0.01 weight % to 20 weight %, preferably 1-10 weight %, depending on the physical parameters and the chemical compositions of the polymer.

The organic solvent is not particularly limited as long as it does not substantially dissolve the resist pattern, and may be suitably selected in accordance with the intended use. For example, an alcohol solvent, an ether solvent, an ester solvent and a ketone solvent are preferably exemplified.

Examples of the alcohol solvent include a monohydric alcohol like methyl alcohol, ethyl alcohol, n-propyl alcohol, isopropyl alcohol, n-butyl alcohol, se c-butyl alcohol, tert-butyl alcohol, isobutyl alcohol, n-hexyl alcohol, n-heptyl alcohol, n-octyl alcohol, n-decanol, methyl isobutyl carbinol and 3-methoxy-butanol; a glycol solvent like ethylene glycol, diethylene glycol, and triethylene glycol; and a glycol ether solvent containing a hydroxyl group like ethylene glycol monomethyl ether, propylene glycol monomethyl ether, diethylene glycol monomethyl ether, triethylene glycol monoethyl ether, methoxymethyl butanol, ethylene glycol monoethyl ether, ethylene glycol monoproyl ether, ethylene glycol monobutyl ether, propylene glycol monoethyl ether, propylene glycol monopropyl ether, propylene glycol monobutyl ether, and propylene glycol monophenyl ether. Preferred example thereof includes methyl isobutyl carbinol.

Examples of the ether solvent include dipropyl ether, dibutyl ether, diethyl ether, methyl tertiary-butyl ether, and anisole. Preferred example thereof includes dibutyl ether.

Examples of the ester solvent include, methyl acetate, ethyl acetate, isopropyl acetate, butyl acetate, amyl acetate, isoamyl acetate, ethyl methoxy acetate, ethyl ethoxy acetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, propyl formate, butyl formate, ethyl lactate, propyl lactate, butyl lactate, ethylene carbonate, propylene carbonate, butylene carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-2-hydroxy propionate, ethyl-2-hydroxy propionate, methyl-3-methoxy propionate, ethyl-3-methoxy propionate, ethyl-3-ethoxy propionate, propyl-3-methoxy propionate, and lactones like γ-butyrolactone and γ-valerolactone. Preferred example thereof includes butyl acetate.

Examples of the ketone solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, and isophorone. Preferred example thereof includes 4-heptanone.

Each of these organic solvent may be used alone or in combination with two or more. The content of the organic solvent in the shrink material can be suitably determined in accordance with the type and the content of the polymer.

Pattern Formation Method

The following is an explanation of the method according to the present invention for forming a fine resist pattern. The pattern formation method described below is a typical one using the shrink material of the present invention.

First, a chemically amplified photoresist is applied on a surface, which may be pretreated if necessary, of a substrate such as a silicon substrate, according to a known coating method such as spin-coating method, to form a chemically amplified resist layer. Prior to applying the resist, an antireflective coating may be beforehand formed on the substrate surface. The antireflective coating can improve shape of the section and the exposure margin.

Any known chemically amplified resist can be used in the pattern formation method of the present invention. The chemically amplified photoresist generates an acid when exposed to radiation such as UV light, and the acid serves as a catalyst to promote chemical reaction by which solubility to an alkali developer is changed within the areas irradiated with the radiation to form a pattern. For example, the chemically amplified photoresist comprises an acid-generating compound, which generates an acid when exposed to radiation, and an acid-sensitive functional group-containing resin, which decomposes in the presence of acid to form an alkali-soluble group such as phenolic hydroxyl or carboxyl group. The photoresist may comprise an alkali-soluble resin, a crosslinking agent and an acid-generating compound.

In the present invention, the photoresist in the areas where the alkali-soluble groups are not formed is removed with an organic solvent developer to obtain a photoresist pattern. Accordingly, the obtained pattern is of a negative type, in which the resist remains in the areas exposed to radiation. This means that a negative pattern is formed from the chemically amplified photoresist that functions as a positive-working type resist when developed with a normal alkali developer.

According to necessity, the chemically amplified photoresist layer formed on the substrate is prebaked, for example, on a hot plate to remove solvent contained in the photoresist, to form a photoresist film having a thickness of about 50 to 500 nm. The prebaking temperature depends on the solvent and the photoresist, but is normally about 50 to 200° C., preferably about 70 to 150° C.

The photoresist film is then subjected to exposure through a mask, if necessary, by means of known exposure apparatus such as a high-pressure mercury lamp, a metal halide lamp, an ultra-high pressure mercury lamp, a KrF excimer laser, an ArF excimer laser, an EUV irradiation system, a soft X-ray irradiation system, and an electron beam lithography system.

After the exposure, baking treatment may be carried out, if necessary, and then development such as paddle development is carried out to form a resist pattern. In the present invention, the resist is developed with an organic solvent developer. Any organic solvent developer can be used as long as it does not dissolve the photoresist film in the part exposed to radiation that becomes soluble in an alkaline aqueous solution. The photoresist film in the part insoluble in an alkaline aqueous solution, that is unexposed to radiation, is generally easily dissolved in organic solvents.

An organic solvent developer can be selected from a relatively wide range of solvents. Actually, it can be selected from hydrocarbons and polar organic solvents such as ketones, esters, alcoholic solvents, amides and ethers.

Examples of the ketones include 1-octanone, 2-octanone, 2-nonanone, 4-heptanone, 1-hexanone, 2-hexanone, diisobutyl ketone, cyclohexanone, methyl ethyl ketone, methyl isobutyl ketone, and acetophenone.

Examples of the esters include ethyl acetate, n-propyl acetate, isopropyl acetate, n-butyl acetate, propyleneglycol monomethyl ether acetate, ethylene-glycol monoethyl ether acetate, diethyleneglycol mono-butyl ether acetate, diethyleneglycol monoethyl ether acetate, 3-methoxybutyl acetate, 3-methyl-3-methoxy-butyl acetate, ethyl lactate, butyl lactate, and propyl lactate.

Examples of the alcoholic solvents include alcohols, such as ethyl alcohol, n-propyl alcohol, iso-propyl alcohol, n-butyl alcohol, sec-butyl alcohol, n-hexyl alcohol, and n-heptyl alcohol; glycols, such as ethylene glycol, propylene glycol, and diethylene glycol; and glycol ethers, such as ethyleneglycol monomethyl ether, propyleneglycol monomethyl ether, diethyleneglycol monomethyl ether, triethyleneglycol monoethyl ether, and methoxymethyl butanol.

Examples of the ethers include the above glycol ethers, di-n-propyl ether, di-n-butyl ether, dioxane, and tetrahydrofuran.
Examples of the amides include N-methyl-2-pyrrolidone, N,N-dimethylacetamide, and N,N-dimethylformamide.

Examples of the hydrocarbons include aromatic hydrocarbons, such as toluene and xylene; and aliphatic hydrocarbons, such as pentane, hexane, octane and decane.

Those organic solvents can be used in combination of two or more, and also can be combined with inorganic solvents such as water unless they impair the effect of the present invention.

After the development, the resist pattern is preferably rinsed (washed) with a rinse solution. In the present invention, the rinsing procedure is preferably carried out with a rinse solution containing at least one organic solvent selected from the group consisting of alkanes, ketones, esters, alcohols, amides and ethers.

Examples of the rinse solution used in the rinsing procedure after the development include n-hexyl alcohol, n-heptyl alcohol and benzyl alcohol. Two or more of those solvents may be mixed, and further they may be mixed with other solvents including water.

The rinse solution may contain water in an amount of preferably 10 wt % or less, further preferably 5 wt % or less, particularly preferably 3 wt % or less. If the water content is 10 wt % or less, the development can be favorably completed. The rinse solution may contain a proper amount of surfactants.

Subsequently, the obtained resist pattern is fattened by applying the shrink material of the present invention. However, prior to applying the composition, the resist pattern may be subjected to surface treatment by applying water or an organic solvent not dissolving the pattern. This surface treatment improves the coatability of the composition, so that the composition can be spread evenly. This means that the coatability can be improved without adding additives for improving the coatability, such as surfactants, into the composition. This treatment is often referred to as "pre-wet treatment".

Thereafter, the shrink material of the present invention is applied to cover the whole resist pattern, and consequently the resist pattern is fatten or thicken by the interaction between the resist pattern and the shrink material. This interaction is presumed to be impregnation of the polymer of the shrink material into the resist and/or diffusion the polymer of the resist pattern into the shrink material and/or adhesion of the polymer onto the resist pattern, whereby the resist pattern is fattened or thickened.

Specifically, the shrink material of the present invention soaks into and/or attaches onto the inner walls of grooves or holes of the resist pattern, to fatten or thicken the pattern. As a result, the shrink material narrows the width of furrow lines separating the ridges in the pattern, and thereby enables to reduce the pitch size and hole opening size of the resist pattern more than the resolution limit.

In the pattern formation method of the present invention, the shrink material can be applied according to any of the coating methods conventionally adopted for applying photoresist resin compositions. For example, spin coating method can be used.

If necessary, the resist pattern coated with the shrink material can be baked. The baking may be carried out on a hot plate while the temperature is either kept constant or elevated step-by-step. After coated with the shrink material, the resist pattern is baked at, for example, 40 to 200° C., preferably 80 to 160° C., for 10 to 300 seconds, preferably 30 to 120 seconds. This baking procedure is for the purpose of helping the interaction between the polymer of the shrink material and the resist pattern.

As a result of applying and baking the shrink material, the resist pattern is fattened to increase the width of the ridge lines of the pattern and to reduce the diameter of the hole pattern. Those dimension changes can be controlled by selecting the conditions such as the temperature and time of baking, the kind of the photoresist resin composition and the like. The conditions are determined according to how far the resist pattern must be miniaturized, namely, how much the width of the ridge lines in the resist pattern must be broadened and/or how much the diameter of the hole pattern must be reduced. However, each dimension change in the resist pattern normally ranges from 5 to 30 nm in difference between before and after application of the shrink material.

After the resist pattern is interacted with the shrink material, the shrink material which is not interacted with the resist pattern can be rinsed away with water or solvents, if necessary. The water or solvents for rinsing must have poor ability to dissolve the resist pattern treated with the shrink material but must have high ability to dissolve the extra shrink material, which is neither interacted with nor attached onto the resist pattern. It is preferred to use a solvent contained in the shrink material.

In the way described above, the resist pattern immediately after development undergoes dimension change by the interaction with the shrink material, to obtain a miniaturized resist pattern. The resist pattern thus produced by use of the shrink material according to the present invention is advantageously used in producing semiconductor devices or the like having finer patterns.

The examples below serve to illustrate the invention without limiting it. Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

Resist Pattern Formation Example

An 8-inch silicon wafer was spin-coated with a bottom antireflective coating forming composition (AZ ArF-1C5D [trademark], manufactured by Merck Performance Materials G.K.) by means of a spin coater (manufactured by Tokyo Electron Ltd.), and then baked at 200° C. for 60 seconds to form an antireflective coat of 37 nm thickness. Subsequently, a photosensitive resin composition (AZ AX2110P [trademark], manufactured by Merck Performance Materials G.K.) was applied thereon and baked at 100° C. for 60 seconds to form a resist layer of 120 nm thickness. The obtained wafer was then subjected to pattern exposure by means of an ArF-beam (193 nm) exposure apparatus (manufactured by Nikon Corporation), and thereafter baked at 110° C. for 60 seconds. Successively, the wafer was subjected to development (negative development) for 30 seconds by use of 2-heptanone as a developer, to obtain a resist pattern having a pitch size of 110 nm and a hole size of 60 nm.

Example of Polymer Synthesis (Synthesis of poly (4-vinylpyridine))

In a reaction vessel equipped with a stirrer, a condenser and a thermostat, ethyl alcohol (1000 mL), water (1000 mL), purified 4-vinylpyridine (52.6 g, 0.5 mol) and hydrogen peroxide (1.7 g, 0.05 mol) were mixed to prepare a monomer solution and then purged with nitrogen gas for 30 minutes. The reaction vessel was placed in a heating apparatus in which the temperature was kept at reflux temperature, and thereby the monomer solution was reflux for 12 hours. After cooled to room temperature, the polymer was isolated by removing the solvents under vacuum. To the polymer, methyl isobutyl carbinol was added to prepare a poly (4-vinylpyridine) solution with Mw 12,500 g/mol. The results are described in Example 1 of Table 1.

Example of Polymer Synthesis (Synthesis of poly (3,5 pyridine))

In a dried reaction vessel equipped with a stirrer, a condenser and a thermostat, 3-bromo-5-iodopyridine (0.148 g, 0.52 mmol) was placed and then purged with nitrogen gas for 30 minutes. Dried tetrahydrofuran 2.6 mL and isopropylmagnesium chloride in ethyl ether (1 mol/L) 0.52 mL were added to 3-bromo-5-iodopyridine and stirred at 0° C. for 0.5 hour. Subsequently, 0.0050 g (9.22 μmol) of [1,3-Bis(diphenylphosphino)propane]nickel(II) chloride suspended in 2.6 mL of tetrahydrofuran was added to the solution and stirred at room temperature for 0.5 hour. After the reaction, 5M HCl and 10wt % NaOH aqueous solution was added to the solution. The polymer was extracted with chloroform and washed with water and dried with anhydrous magnesium sulfate. Poly (3,5 pyridine) with Mw 11,000 g/mol was obtained. The results are described in Example 2 of Table 1.

Example of Polymer Synthesis (Synthesis of 2-vinylpyridine/Styrene Copolymer)

In a reaction vessel equipped with a stirrer, a condenser and a thermostat, methyl amyl ketone 2000 mL, purified 2-vinylpyridine (210.3 g, 2.0 mol), purified styrene monomer (52.1 g, 0.5 mol) and dimethyl 2,2'-azobis(2-methyl isobutylate) (5.76 g, 0.025 mol) were mixed to prepare a monomer solution and then purged with nitrogen gas for 30 minutes. The reaction vessel was placed in a heating apparatus in which the temperature was kept at 80° C., and thereby the monomer solution was kept at 80° C. for 6 hours. The results are described in Example 3 of Table 1.

After cooled to room temperature, the solution was poured into n-heptane (15000 mL) to form white precipitates. The precipitates were isolated by filtration under reduced pressure, and dissolved in tetrahydrofuran (2000 mL). The obtained solution was again poured into n-heptane (15000 mL) to form white precipitates. The precipitates were isolated by filtration under reduced pressure, and dried overnight at 50° C. in a vacuum oven to obtain white powdery 2-vinylpyridine/styrene (80/20) copolymer with Mw 14,200 g/mol.

Measurement of Weight Average Molecular Weight

Weight average molecular weight was determined by gel permeation chromatography (GPC) using GPC columns and under analysis conditions involving a flow rate of 1.0 mL/min, an elution solvent of tetrahydrofuran and a column temperature of 40° C. using mono-dispersed polystyrene as a standard.

Preparation of Shrink Material Composition

The polymers were dissolved in solvents to prepare shrink material compositions. Table 1 shows the components and the contents thereof in each composition.

Evaluation of Hole Pattern Reduction

Each prepared composition was applied on the resist pattern, and heated at 130° C. for 60 seconds. The pattern coated with the composition was washed with n-butyl acetate or methyl isobutyl carbinol, and then dried. The dimension reduction of the obtained hole pattern was measured by using Critical Dimension-Scanning Electron Microscope Verity 4i (manufactured by Applied Materials, Inc.) to evaluate effect of the shrink material composition. The results are described in Table 1.

TABLE 1

| | Polymer | Weight average molecular weight | Solvent | Solid content (wt %) | Demension reduction (nm) |
|---|---|---|---|---|---|
| Example 1 | Poly (4-vinylpyridine) | 12.500 | Methyl isobutyl carbinol | 5.0 | 16.0 |
| Example 2 | Poly (3,5 pyridine) | 11.000 | n-Butyl acetate | 5.0 | 15.6 |
| Example 3 | 2-Vinylpyridine/styrene copolymer [80/20] | 14.200 | Methyl isobutyl carbinol | 5.0 | 16.8 |
| Comparative example 1 | Novolac | 12.000 | n-Butyl acetate | 5.0 | 2.4 |
| Comparative example 2 | Polyhydroxystyrene | 14.000 | n-Butyl acetate | 5.0 | 4.4 |
| Comparative example 3 | Poly (4-vinylpyridine) | 800 | Methyl isobutyl carbinol | 5.0 | 1.8 |
| Comparative example 4 | Poly (4-vinylpyridine) | 33.200 | Methyl isobutyl carbinol | 5.0 | Not available |

The invention claimed is:

1. A method for forming a resist pattern, comprising:
a) providing a substrate with a resist pattern prepared from a negative-tone lithography process;
b) coating the resist pattern with a shrink material composition for fattening a resist pattern prepared from a negative-tone lithography process, comprising at least one polymer and at least one organic solvent, wherein the at least one polymer is
(A) a homopolymer or copolymer of the following formula:

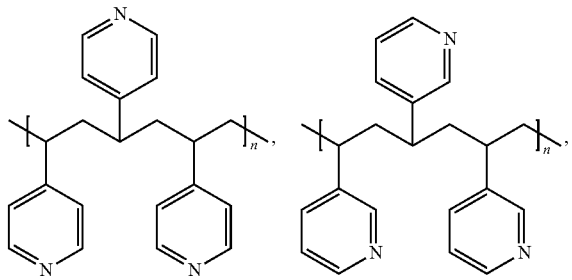

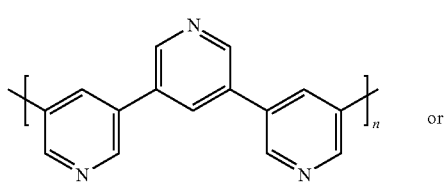

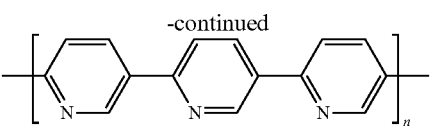

wherein n is 96 to 250
or
(B) a copolymer of the following formula

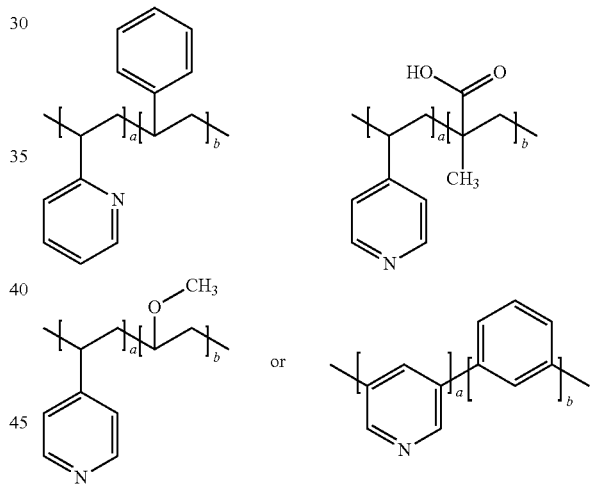

wherein a and b is a number indicating the molar ratio of each repeating unit wherein the molar ratio of the repeating unit including pyridine ring is 50-90%
c) inter-mixing a portion of the shrink material in contact with the resist pattern; and
d) removing a portion of the shrink material which is not inter-mixed with a removal solution.

2. The method according to claim 1, wherein the substrate is heated to cause an inter-mixing of the shrink material with the resist pattern.

3. The method for forming a resist pattern according to claim 1, wherein the at least one organic solvent is selected from a ketone, an ether, an ester and an alcohol and mixtures thereof.

4. The method for forming a resist pattern according to claim 1, wherein said at least one polymer is contained in an amount of 0.01 to 20 wt % based on the total weight of the composition.

5. The method for forming a resist pattern according to claim 1, wherein said polymer has a weight average molecular weight in the range from 10,000 to 20,000 g/mol.

6. The method for forming a resist pattern according to claim 1, wherein said at least one polymer is a homopolymer the following formula:

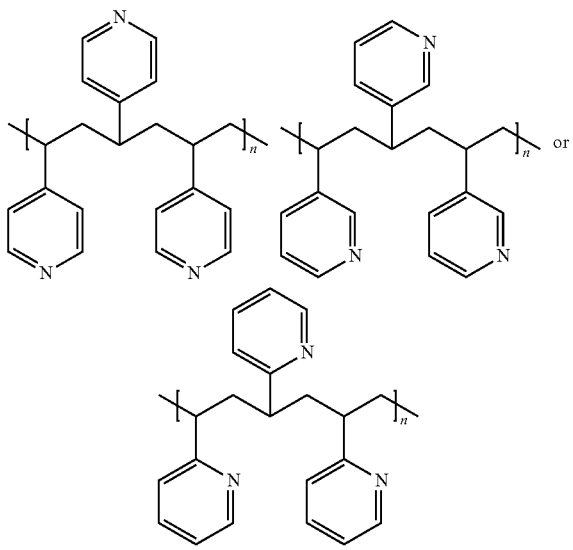

wherein n is 96 to 250.

7. The method for forming a resist pattern according to claim 1, wherein said polymer is a copolymer of the formula:

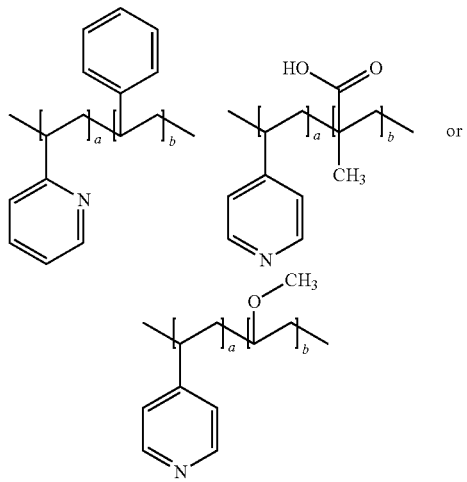

wherein a and b is a number indicating the molar ratio of each repeating unit wherein the molar ratio of the repeating unit including pyridine ring is 50-90%.

8. The method for forming a resist pattern according to claim 1, wherein the polymer is a copolymer which is 2-Vinylpyridine/styrene copolymer.

9. The method for forming a resist pattern according to claim 1, wherein the polymer is a homopolymer which is poly (4-vinylpyridine).

10. The method for forming a resist pattern according to claim 1, wherein the at least one polymer is A. a homopolymer which is selected from the group consisting of poly(2-vinylpyridine), poly(3-vinylpyridine) and poly(4-vinylpyridine), or
B. a copolymer which is selected from the group consisting of poly(2-vinylpyridine-co-styrene), poly(4-vinylpyridine-co-methylvinylether), and poly(4-vinylpyridine-co-methacrylic acid).

11. The method for forming a resist pattern as claimed in claim 1, wherein the at least one polymer is
(A) a homopolymer or copolymer of the following formula:

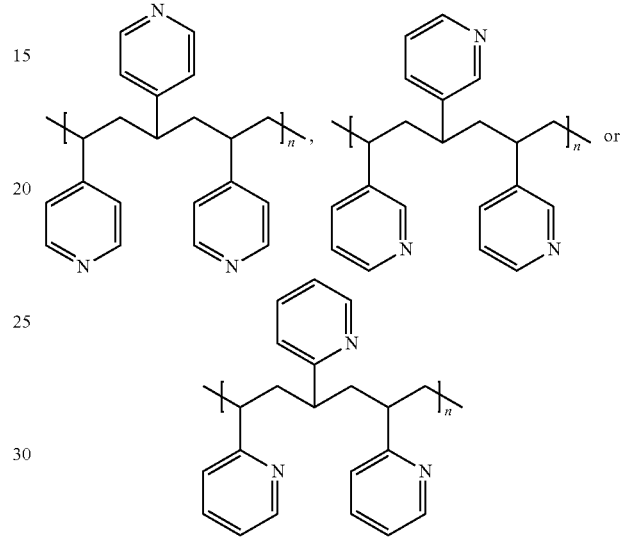

wherein n is 96 to 250
or
(B) a copolymer of the following formula

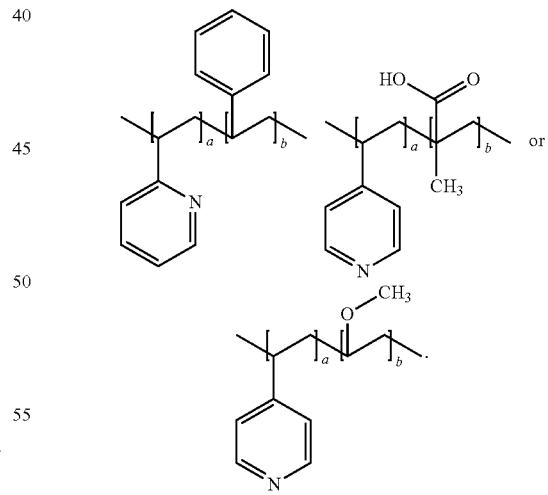

12. A method for forming a resist pattern, comprising:
a) providing a substrate with a resist pattern prepared from a negative-tone lithography process;
b) coating the resist pattern with a shrink material composition for fattening a resist pattern prepared from a negative-tone lithography process, comprising at least one polymer and at least one organic solvent, wherein the at least one polymer wherein the polymer is a homopolymer which is selected form the group consisting of poly(3,5 pyridine) and poly(4-vinylpyridine) or a 2-Vinylpyridine/styrene copolymer, c) inter-mixing a portion of the shrink material in contact with the resist pattern; and d) removing a portion of the shrink material which is not inter-mixed with a removal solution.

* * * * *